United States Patent [19]
Montijo

[11] Patent Number: 5,180,971
[45] Date of Patent: Jan. 19, 1993

[54] METHOD AND APPARATUS FOR INCREASING THROUGHPUT IN RANDOM REPETITIVE DIGITIZING SYSTEMS

[75] Inventor: B. Allen Montijo, Colorado Springs, Colo.

[73] Assignee: Hewlett-Packard Company, Palo Alto, Calif.

[21] Appl. No.: 716,460

[22] Filed: Jun. 17, 1991

Related U.S. Application Data

[62] Division of Ser. No. 487,685, Mar. 2, 1990.

[51] Int. Cl.[5] .......................................... G01R 13/20
[52] U.S. Cl. .............................. 324/121 R; 324/77 A; 364/487
[58] Field of Search ............. 324/121 R, 77 R, 77 A; 364/487; 340/722; 328/151

[56] References Cited

U.S. PATENT DOCUMENTS

| | | | |
|---|---|---|---|
| 4,072,851 | 2/1978 | Rose | 324/77 R |
| 4,641,246 | 2/1987 | Halbert et al. | 364/487 |
| 5,003,248 | 3/1991 | Johnson | 324/121 R |

Primary Examiner—Ernest F. Karlsen

[57] ABSTRACT

Circuits for increasing throughput in random repetitive signal acquisition systems that use triggers. The circuits allow the random repetitive signal acquisition systems to terminate an acquisition only when there is a high probability that usable samples have reached the systems. The circuits comprise logic elements for producing a qualifier signal having at least two input ports. A first delay element is coupled to a first input of the logic element for introducing a first delay in a sample signal, thereby producing a first delayed sample signal for setting the logic element and enabling the qualifier signal. A second delay element is coupled to a second input port of the logic element for introducing a second delay in the sample signal, thereby producing a second delayed sample signal for resetting the logic element and disabling the qualifier signal. The qualifying signal qualifies a trigger signal produced by trigger circuitry in the random repetitive signal acquisition system. The qualifier signal is generally periodic and is particularly useful in qualifying a trigger signal in a digitizing oscilloscope.

17 Claims, 9 Drawing Sheets

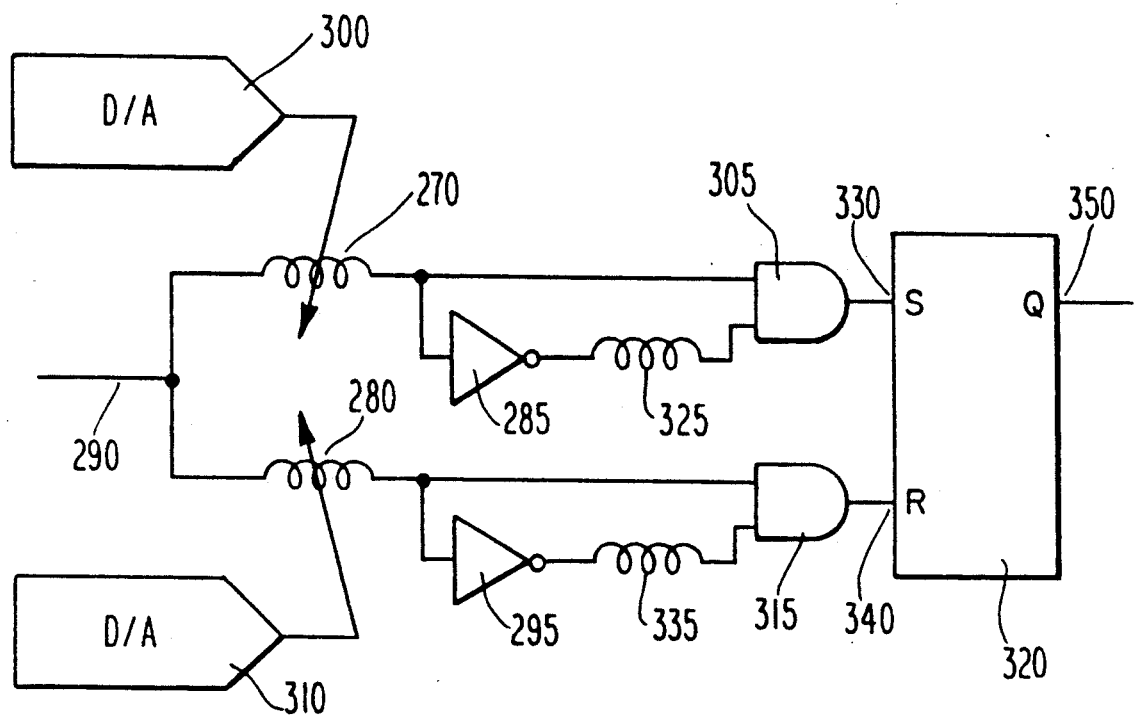
_Fig. 2A_
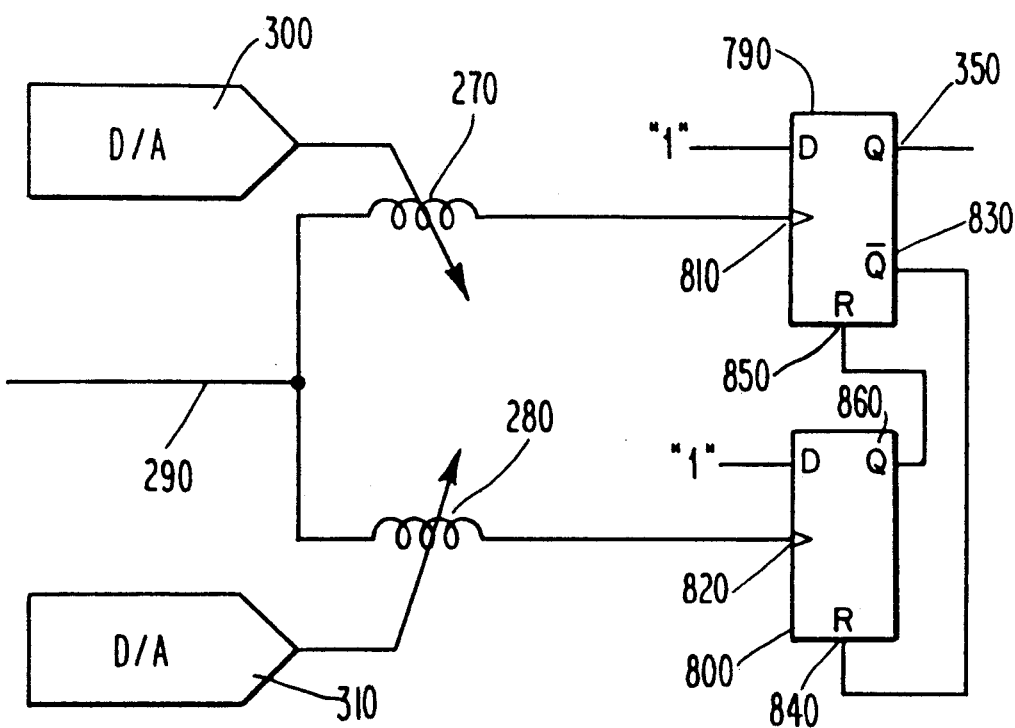
_Fig. 2B_

METHOD AND APPARATUS FOR INCREASING THROUGHPUT IN RANDOM REPETITIVE DIGITIZING SYSTEMS

This is a division of application Ser. No. 07/487,685, filed Mar. 2, 1990.

This invention relates to methods and apparatus for increasing throughput in systems which sample repetitive signals. More specifically, this invention is directed to random repetitive signal acquisition systems which utilize trigger and trigger qualifying circuitry.

BACKGROUND OF THE INVENTION

The oscilloscope has been a tool of technicians, engineers and designers for analyzing time domain signals for over forty years. Typically, oscilloscopes analyze electrical signals and display the signals on a CRT screen as a function of amplitude (e.g., voltage magnitude) versus time. An oscilloscope combines the time measurement abilities of a frequency counter with the amplitude measurement capabilities of a multimeter to provide useful information concerning the electrical signal of interest.

The oscilloscope thus aids circuit designers in qualifying the performance of a new circuit or any circuit under test. Previously, oscilloscopes were generally analog in nature. In an analog oscilloscope, a signal enters through an attenuator which is generally a variable resistive-divider network. The attenuator brings the input signal to within an input operating range of a preamplifying circuit ("preamp").

The preamp and the attenuator scale the signal and apply any gain factors which are desired for the particular application and circuit being examined. The preamp circuit also drives a multiplexer which then drives a voltage amplifier and ultimately drives the vertical sweep of the cathode ray tube (CRT). Additionally, the preamp provides high to low impedance conversion so that the analog oscilloscope can be made virtually noise-free.

The trigger circuitry in the analog oscilloscope is operatively coupled to the horizontal sweep circuit of the CRT. The trigger circuit activates the horizontal sweep of the CRT when the trigger circuit acquires a trigger signal. The trigger signal is generally acquired from the input signal through a trigger comparator circuit which outputs a pulse when some predetermined trigger criteria are satisfied. The trigger pulse starts a capacitive charge that ramps a voltage level. This causes the beam in the CRT to move across the screen horizontally and thus display the signal characteristics of the input signal as a function of voltage versus time.

The ramp voltage which generates the horizontal sweep is typically obtained from a charging capacitor. However, in the real world it is difficult to linearly charge a capacitor with a current source to within acceptable high accuracy. Furthermore, capacitive charging is usually not constant and, thus, creates inaccuracies in the sweep. These factors contribute to inaccuracy in timing measurements.

The inaccuracy in timing measurements in typical analog oscilloscopes is about 3% of full scale. As an example of the timing measurement inaccuracies encountered with an analog oscilloscope, consider measuring a 2 nanosecond (ns) pulse width at 1 ns per division on the screen of a scope. The accuracy of this measurement is thus 0.3 ns or 15% timing error. Thus, analog oscilloscopes do not satisfy a long-felt need in the art for devices which can measure signal characteristics with high accuracy.

Additionally, factors besides the gain error must be taken cumulatively into account in order to make accurate voltage measurements with an analog oscilloscope. Analog oscilloscopes also exhibit significant position and parallax errors which reduce voltage measurement accuracy. Other factors, such as low storage tube capability and large bandwidth rolloff also contribute significantly to inaccurate voltage measurements with an analog oscilloscope. Analog oscilloscopes thus cannot satisfy a long-felt need in the art for measurement systems which provide highly accurate voltage and time measurements of electrical signals.

Digitizing or "digital" oscilloscopes have been developed to solve some of the aforementioned problems exhibited with analog oscilloscopes. For example, a typical digitizing oscilloscope's timing error is about 0.002% of full scale. A digitizing oscilloscope exhibits superior timing error with respect to the 3% typical timing error in an analog oscilloscope by using a crystal timebase instead of a charging capacitor and ramp voltage in the horizontal sweep circuitry. Other advantages such as the elimination of parallax error can be achieved with a digitizing oscilloscope.

Typically, a digitizing oscilloscope uses the same type of trigger comparator circuitry as found in an analog oscilloscope. Furthermore, similar attenuation and preamplifying inputs as found on the vertical paths of an analog oscilloscope may be provided for each channel of information on a digital oscilloscope. However, with a digitizing oscilloscope it is not necessary to use a multiplexer on the vertical paths. Digitizing oscilloscopes also operate in a significantly different fashion than analog oscilloscopes in acquiring and displaying data. A digitizing oscilloscope uses an analog-to-digital converter (ADC) which converts scaled, impedance converted analog data into digital words. The digital words are then stored in an acquisition memory so that they may be bused to a central processing unit (CPU) or microprocessor for eventual display on a CRT screen or use in other data acquisition and manipulation systems.

The ADC digitizes the analog signal data which comes over the various input channels. The digital information is then typically stored in a memory which may be, for example, a ring memory structure. A ring memory begins filling memory with data words at some location and continues adding more words around the ring. Ring memories offer an advantage when used in digitizing oscilloscopes since a full ring of digitized data taken prior to the trigger event is available to the system when "negative time," i.e. events which happen before a trigger, data acquisition is accomplished. The typical memory length for each digital ring in a digital oscilloscope is from 1 to 2 kbytes.

A crystal timebase, generally a clock circuit, updates the CPU in the digitizing oscilloscope and informs the CPU where in the ring memory the trigger event has occurred. The crystal provides accurate and stable timing for the analog oscilloscope. Circuitry in the crystal timebase determines the timing between the asynchronous trigger event and the next sample point because a trigger event can occur between sample points, not necessarily on a sample point. Since the sample clock and the timebase are derived from a crystal oscillator, the timing accuracy of a digitizing oscilloscope is very good; typically around 0.002%.

In an analog oscilloscope, the trigger event is always at the farthest point on the left-hand side of the CRT screen. However, in a digitizing oscilloscope the trigger event may be placed at the center of the CRT screen. Thus, with a digitizing oscilloscope the user sees half of the screen in a pre-trigger time, and half of the screen in a post-trigger time. A control is provided to the digitizing oscilloscope which allows the trigger event to be moved from left to right on the CRT screen by the user. This ability to alter the position of the trigger on the CRT screen provides a significant advantage over displays on analog oscilloscopes since it is possible to home in on a particular event around the trigger reference point on the CRT screen with a digitizing oscilloscope.

Generally, there are two ways to acquire digitized data with a digitizing oscilloscope. The first way is by real time acquisition, sometimes referred to as "single-shot sampling". Single shot sampling digital oscilloscopes sample an input waveform as fast as the ADC in the oscilloscopes sample and acquire all of the digitized data on a single trigger. State-of-the-art digitizing oscilloscopes using single-shot sampling data acquisition generally allow about one "Giga sample" (GSa/s) per second at 6 to 8 bits resolution. Single-shot sampling is possible with both repetitive and non-repetitive signals. However, single-shot digitizing oscilloscope are generally much more expensive than other types of digitizing oscilloscopes.

Single-shot data acquisition digitizing oscilloscopes exhibit significant disadvantages to digitizing oscilloscopes which utilize other types of sampling. For example, it is very easy to miss glitches between sampling points with a single-shot digitizing oscilloscope. These high-frequency glitches are also missed when a similar bandwidth analog oscilloscope is used. Additionally, the bandwidth of a single-shot oscilloscope is limited by the sampling frequency. Furthermore, the timing resolution of a single-shot digitizing oscilloscope is limited by the speed of the ADC. Thus, single-shot sampling digital oscilloscopes do not satisfy a long-felt need in the art for digital oscilloscopes which provide accurate and efficient analysis of electrical input signals.

The second way in which data may be acquired by a digitizing oscilloscope is with "repetitive sampling." Repetitive sampling is used when a repetitive waveform is present. As known by those skilled in the art, a repetitive waveform is any waveform which has a regular period. Repetitive sampling systems do not make single-shot measurements well because they are designed with slower ADCs. This allows better vertical resolution of the repetitive signal. An example of a digital oscilloscope which utilizes both single-shot and repetitive sampling in two different modes is the HP 54111D digital oscilloscope available from the Hewlett-Packard Company, Palo Alto, Calif.

There are essentially two kinds of repetitive sampling used by digital oscilloscopes. The first kind of repetitive sampling is called "sequential repetitive sampling". In sequential repetitive sampling, only one sample of the signal is digitized on each occurrence of the trigger signal. With each successive trigger, the sampling point is delayed further from the trigger point. After many samples are acquired and digitized, the signal is reconstructed in the oscilloscope's digital memory. Sequential sampling works by delaying data acquisition by a specified amount of time after the trigger event occurs, then taking a sample. The amount of the delay starts at zero seconds and evenly increments depending on the capability of the digitizing oscilloscope.

With sequential repetitive sampling, timing resolution is excellent compared to real-time, single-shot sampling in digitizing oscilloscopes. Additionally, sequential sampling does not miss glitches unless the glitches occur in time periods less than the sampling delay resolution of the timebase. Furthermore, the bandwidth in a digitizing oscilloscope utilizing sequential repetitive sampling is not limited by the sampling frequency, but rather is merely limited by the particular capabilities of the preamplifiers and attenuators in the front end of the digital oscilloscope.

However, there are several disadvantages inherent in sequential repetitive sampling digital oscilloscopes. The first of these disadvantages is the need to wait for a trigger signal before the sample is taken which does not provide the desirable capability of viewing negative time without a delay line. Furthermore, there is no single-shot capability with sequential sampling because each sample point requires a full trigger event. Additionally, with slow repetition signals, triggers occur slowly, and thus, acquisition of a complete representation of the signal for display takes a long time to complete.

The second type of repetitive sampling is called "random repetitive sampling." In random repetitive sampling, the ADC is always sampling at the same rate. Thus depending upon the "samples per division" (Sa/DIV) of the screen, a different number of samples per trigger may be obtained. The waveform in random repetitive sampling is built up over multiple trigger acquisitions. Random repetitive sampling is denoted as "random" since the trigger event is asynchronous with respect to the sample clock. This means that each trigger yields a group of samples that are shifted in phase between other groups of samples. After each acquisition, the data collected on that acquisition is time correlated by a time interpolator to the trigger event and to the older data points acquired and placed on the screen. Random repetitive sampling is dissimilar to sequential repetitive sampling to the extent that the signal is constantly being sampled and digitized at a rate determined by the digital oscilloscope sampling clock.

Random repetitive sampling provides several advantages over sequential sampling. In random repetitive sampling digital oscilloscopes, the user can view sampling in negative time without the need for a delay line. Furthermore, random repetitive sampling digital oscilloscopes exhibit higher throughput at lower sweep speeds as compared to sequential sampling digital oscilloscopes.

However, random repetitive sampling exhibits significant problems when a digital oscilloscope samples high frequency input signals. At fast sweep speeds, the probability of acquiring a small display window is reduced as compared to acquiring a small display window in a sequential repetitive sampling system. Therefore, the throughput of random repetitive sampling digital oscilloscopes is reduced at fast sweep speeds. Thus, random repetitive sampling digitizing oscilloscopes do not have optimal throughput when a user needs fine time resolution for a measurement. As used herein, the term "fine time resolution" is defined with respect to the actual sample rate of the instrument being used.

This point may be illustrated by the following example. Consider a random repetitive acquisition system where the actual sample rate is 40 MHz and the screen width is 1 ns (100 psec/DIV). The time between samples is thus 1/40 MHz which is equal to 25 ns — 25 times as large as the time interval being examined. Since the system is sampling randomly with respect to the signal, the system is also sampling randomly with respect to the trigger. The trigger can thus occur anywhere within the 25 ns sampling interval and there will be a probability of 1/25 that a sample will fall within the 1 ns screen window. Therefore, on the average, only one in 25 acquisitions results in a usable sample.

This is a poor result because the overhead time required to perform an acquisition is not negligible. It takes on the order of microseconds to determine if any of the sample points actually fall on the screen and to begin a new acquisition. In modern random repetitive acquisition systems in digitizing oscilloscopes, there is no previously known information about the signal and thus no possibility of changing the probability of 1 out of 25 that a trigger will generate a point on the screen.

If, for example, the triggers are occurring at a 15 MHZ rate, a trigger period of 67 ns is achieved. After the system begins to look for a trigger, the average time to find a trigger is approximately one-half of 67.0 ns, or 33.5 ns. If one assumes an acquisition overhead time of about 6.0 μs, which is typical for a modern, state-of-the-art digitizing oscilloscopes, it takes approximately an average of:

$$25 \text{ acquisitions} \times (6.0 \text{ } \mu s + \tfrac{1}{2} \times 67.0 \text{ } ns) = 150.8 \text{ } \mu s.$$

to acquire a usable sample. This time period occurs since, for every acquisition of data, a 6.0 μs overhead period during which the CPU determines whether that trigger has resulted in a usable sample is tacked on to the acquisition time. This is a highly inefficient way to acquire samples and requires the microprocessor in the digitizing oscilloscope to spend an inordinate amount of processor time in determining whether each acquisition has resulted in usable data. If this acquisition time could be reduced or eliminated for any trigger which does not acquire a useable sample, the throughput of the system could be greatly increased and the microprocessor freed to perform other tasks during the acquisition procedure. Modern random repetitive signal acquisition systems cannot reduce or eliminate this problem.

Present random repetitive sampling digitizing oscilloscopes and systems thus do not fulfill a long-felt need in the art for random repetitive sampling acquisition systems which minimize the reduction in throughput of the system as the sweep speed is increased. Previous trigger detection circuits in random repetitive data acquisition digitizing systems do not — and cannot — enhance efficiency in random repetitive sampling systems and provide increased throughput. A long-felt need in the art therefore exists for trigger qualifying systems and circuitry in random repetitive acquisition systems which increase system throughput and provide more efficient use of microprocessing time.

SUMMARY OF THE INVENTION

Circuits for increasing throughput in a random repetitive signal acquisition system of the type which uses triggers, wherein the circuit allows the random repetitive signal acquisition system to terminate an acquisition only when there is a high probability that usable samples have reached the system, are provided in accordance with the present invention. The circuits comprise logic means for producing a qualifier signal having at least two input ports, first means coupled to a first input port of the logic means for introducing a first delay in a sample signal, thereby producing a first delayed sample signal for setting the logic means and enabling the qualifier signal, and second means coupled to a second input port of the logic means for introducing a second delay in a sample signal, thereby producing a second delayed sample signal for resetting the logic means and disabling the qualifier signal.

A method of arming a trigger circuit in a random repetitive signal acquisition system in accordance with the invention comprises the step of producing a sample signal having a sample period. The sample signal is delayed for a time, thereby producing a delayed sample signal. A periodic qualifier signal is then produced from the delayed sample signal and the trigger circuit is armed periodically with the periodic qualifier signal.

BRIEF DESCRIPTION OF THE DRAWINGS

FIGS. 2A and 2B are circuits for producing qualifier signals provided in accordance with this invention.

DETAILED DESCRIPTION OF PREFERRED EMBODIMENTS

Methods and apparatus provided in accordance with this invention provide trigger qualifying circuitry for any digitizing system which utilizes random repetitive data acquisition and sampling. In preferred embodiments, methods and apparatus provided in accordance with this invention are particularly useful for increasing throughput in digitizing oscilloscopes which utilize random repetitive signal acquisition.

Figure 1:
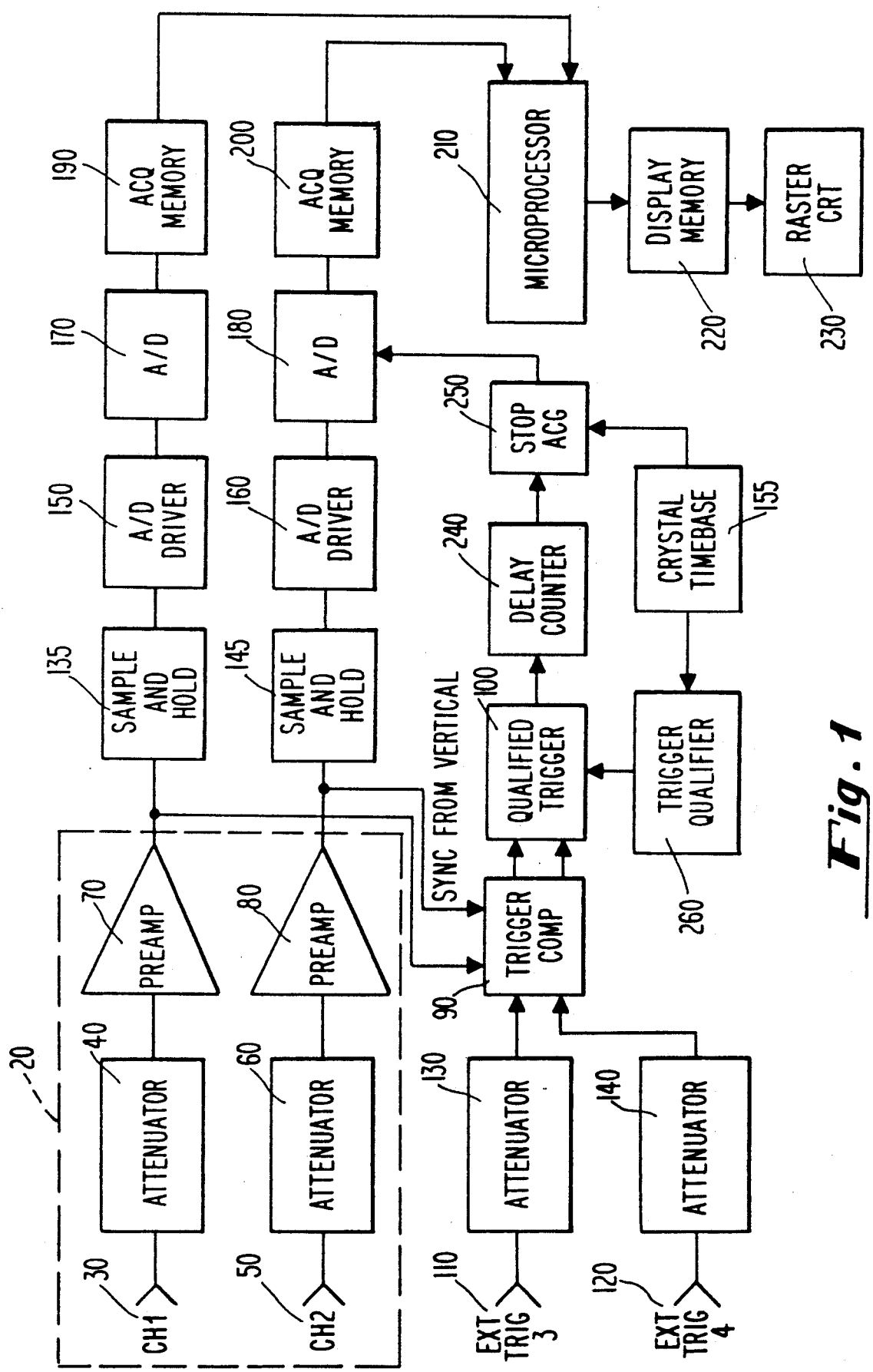
FIG. 1 is a functional block diagram of a digitizing oscilloscope provided in accordance with this invention having trigger qualifier circuitry which increases the throughput of the system.

In to FIG. 1, a functional block diagram of a digitizing oscilloscope provided in accordance with this invention having trigger qualifying circuitry which increases the throughput of the digitizing oscilloscope is shown. Present digitizing oscilloscopes may be modified with circuitry provided in accordance with this invention to obtain qualified triggers and increased throughput. In general, the HP 54100 family of digitizing oscilloscopes available from the Hewlett-Packard Company, Palo Alto, Calif., are readily available for such modification.

The front end 20 of the digital oscilloscope is similar to the front end of most standard analog oscilloscopes. In a preferred embodiment, four channels of information in a vertical path are available for simultaneous acquisition. For ease of illustration, two channels are shown. The signal on channel one, shown at 30, enters an attenuator 40. Similarly, a signal on channel two at 50 enters an attenuator 60.

The attenuators 40 and 60 are generally comprised of variable resistive divider networks which bring the input signal to within the input operating range of preamplifiers 70 and 80. Preamplifiers 70 and 80 work in conjunction with the attenuators 40 and 60 respectively to scale the signal available on channels 30 and 50. In further preferred embodiments, it is possible to have variable gain in preamps 70 and 80. The preamps 70 and 80 also provide trigger comparator circuit 90 with synchronous pulses from the vertical signals coming through over channels 30 and 50. Generally, in previous digital oscilloscopes, trigger comparator 90 is activated on an edge of the signal when one of the channels has a signal which is above some predetermined limit, generally a voltage level.

Trigger comparator 90 inputs signals to qualified trigger circuit 100 when one of the inputs from external triggers 110 or 120 falls above this predetermined voltage level. Qualified trigger 100 qualifies an event, for example a sample signal, before the event actually triggers the digitizing oscilloscope. Attenuators 130 and 140 scale the trigger signals 110 and 120 which are external trigger inputs that cannot be viewed but which may allow the user to view some other event. In preferred embodiments, the trigger comparator circuit is activated on an edge of the repetitive input signal. In still further preferred embodiments, trigger comparator circuit 90 is triggered on a positive edge of the repetitive input signal.

In digitizing oscilloscopes, the input signal or waveform is quantized into discrete time and voltage samples. In repetitive acquisition systems, "sample and hold" circuitry is provided so that signals appearing over channels 30 and 50 can be regularly digitized. Sample and hold blocks 135 and 145 are thus coupled to preamps 70 and 80 respectively. Sample and hold blocks 135 and 145, in preferred embodiments, comprise a sampling clock having a regular periodic frequency. The sampling clocks sample at a constant rate which is dependent upon the particular capabilities of crystal timebase circuitry 155 provided to the digitizing oscilloscope. In preferred embodiments, the sample rate is 40 MHz. It will be recognized by those with skill in the art that other sample rates may be available depending upon the capabilities of the particular analog to digital converters in the digitizing oscilloscope, and the particular applications which will be encountered by the digitizing oscilloscope.

Analog to digital (A/D) driver circuits 150 and 160 are respectively coupled to the outputs of the sample and hold blocks 135 and 145. The A/D drivers 150 and 160 drive a pair of A/D converters 170 and 180 respectively. A/D converters 170 and 180 digitize the analog data coming over channels 30 and 50. The digital information from A/D converters 170 and 180 are then stored in acquisition memories 190 and 200 respectively. In preferred embodiments, acquisition memory depth is from 1-2 k-words in length.

Microprocessor 210 is interfaced with acquisition memories 190 and 200. The microprocessor receives user commands and controls the data acquisition circuitry. The microprocessor 210 collects the data from the data acquisition memories 190 and 200 and displays the data through display memory 220 on a CRT screen 230. The vertical path of the digital oscilloscope can be considered to end with acquisition memories 190 and 200. In preferred embodiments, the vertical path thus synthesizes digital words which correspond to voltage levels in the signal coming over channels 30 and 50.

The data may then be written to the CRT screen memory or buffer. The screen memory is written asynchronously with respect to the CRT beam to the buffer by the microprocessor. The "horizontal sweep" of the digitizing oscilloscope begins when qualified trigger circuit 100 senses an edge signifying a random repetitive signal which should be displayed. Qualified trigger circuit 100 is interfaced with a delay counter 240 which is further interfaced with stop circuitry 250 that communicates with the ADCs 170 and 180 and causes the ADCs to cease acquiring and digitizing data.

In accordance with the present invention, trigger qualifier circuitry 260 is provided having an input from time-base 155. It will be appreciated that trigger qualifier circuit 260 may be part of trigger comparator block 90 such that a circuit block comprising trigger qualifier circuit 260 and qualified trigger circuit 100 outputs an edge or pulse when the input meets some user defined criteria. In preferred embodiments, the event may be a positive edge of the input signal having a predetermined high voltage level. Trigger qualifier circuitry 260 provided in accordance with this invention arms qualified trigger circuit 100 such that the overall throughput of the digitizing oscilloscope is increased.

The crystal timebase 155 and trigger qualifier circuit 260 are set by the user to give the screen width a predetermined value. In preferred embodiments, the screen width is one ns. In further preferred embodiments, the trigger from circuit 100 is set to be 100 psec from the left of the screen. Thus, any sample taken from 100 psec before the trigger to 900 psec after the trigger will lie on the screen. This means that any trigger occurring from 900 psec before the sample to 100 psec after the sample will result in the sample being usable. Thus, trigger qualifying circuit 260 defines a window, with respect to the sample clock in the crystal timebase 155, which determines usable triggers.

In order to make trigger qualifier circuitry 260 functional for a wide range of input signals, trigger qualifier 260 should be flexible, having different start and stop delay settings which may be adjusted by the user microprocessor, or by the user from the digital oscilloscope control panel. In preferred embodiments, the trigger window width should be variable from the minimum screen width up to about the sample clock period. Furthermore, the trigger window's position should be movable to any time position in the sample clock period.

Trigger qualifier circuit 260 forces a trigger enable window to appear within each sample clock period and allows the digitizing oscilloscope to terminate data acquisition only when there is a high probability that usable samples have reached the system. Thus, the time interpolator and microprocessor are not forced to incur overhead time to process most of the unusable triggers, thereby resulting in increased throughput for the system. Trigger qualifier circuit 260 provided in accordance with this invention therefore solves a long-felt need in the art for circuitry which significantly increases the throughput of digitizing oscilloscopes using random repetitive data acquisition and signal sampling.

Referring to FIG. 2A a preferred embodiment of a trigger qualifier circuit 260 that increases the throughput in a random repetitive data acquisition system is shown. Variable delays 270 and 280 are fed by the sample clock output 290 from the crystal timebase 155. Digital to analog converter (DAC) 300 controls the variation to first variable delay 270 while DAC 310 controls the variation to second variable delay 280. The output of variable delays 270 and 280 are inverted at 285 and 295 then "ANDed" at 305 and 315 respectively with the inverted outputs from inverters 285 and 295. The delays 325 and 335 through AND gates 305 and 315 respectively determine the set and reset pulse widths at 330 and 340.

The output of AND gates 305 and 315 are operatively connected to a logic element 320. In preferred embodiments, logic element 320 is a flip-flop and in further preferred embodiments, a set/reset flip-flop. The output of AND gate 305 sets the flip-flop at 330 while the output of AND gate 315 resets or clears the flip-flop at 340. The output 350 of flip-flop 320 is the qualification signal which arms the qualified trigger circuit 100 periodically.

In preferred embodiments, delays 270 and 280 are variable for at least the sample period, and thus any size window from the minimum that the flip-flop can produce up to the sample period width, with any position relative to the sample clock, can be produced. The CPU calculates the appropriate delay values for any combination of timebase settings which may be determined either by the CPU with appropriate programming, or directly by the user. In further preferred embodiments, the delays may be altered by the user though DACs 300 and 310. The circuit arms the trigger signal in a window having a variable width, accepting triggers that fall within the window and rejecting triggers that fall outside of the window.

In to FIG. 2B, yet another preferred embodiment of a circuit which qualifies a trigger and increases the throughput in a random repetitive data acquisition system is shown. Replacing the logic element 320, and associated elements 285, 295, 305, 315, 320, 325 and 335 in FIG. 2A are a pair of "D" flip-flops shown at 790 and 800. In this configuration, the D inputs to the two flip-flops 790 and 800 are kept at logic "1" (high). The output of variable delay 270 is input to the clock port 810 of D flip-flop 790 while the output of variable delay 280 is input to the clock port 820 of D flip-flop 800. The "not Q" output 830 of D flip-flop 790 is coupled to the "reset port" 840 of D flip-flop 800. Furthermore, the reset port 850 of D flip-flop 790 is coupled to the "Q" port 860 of D flip-flop 800. In this configuration, the "Q" output of D flip-flop 790 is the qualification signal 350 which arms the trigger circuit 100 periodically.

Figure 3A:
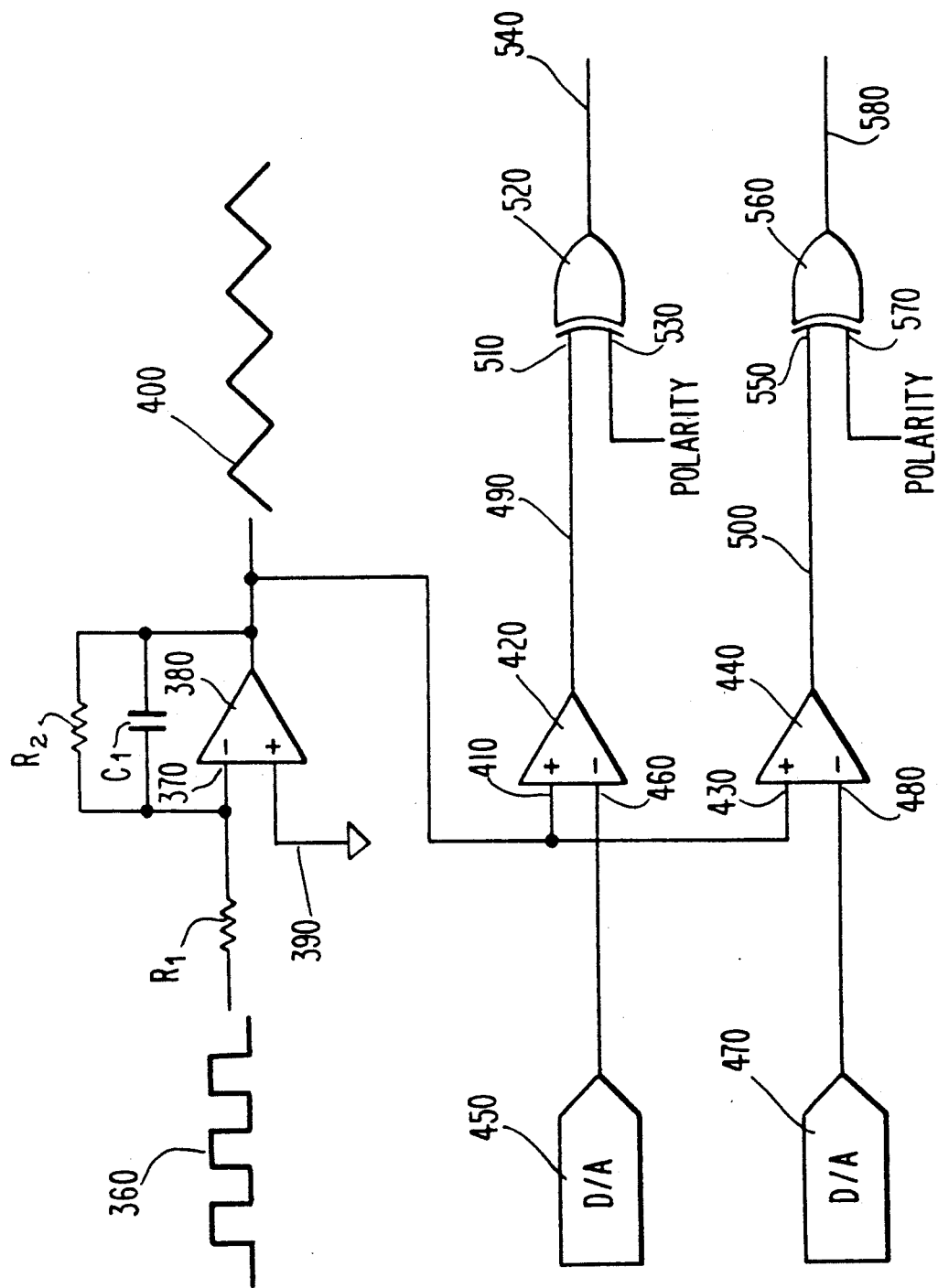
FIGS. 3A and 3B are circuits for producing variably delayed signals for use in the circuits of FIGS. 2A and 2B.

In still further preferred embodiments, variable delays 270 and 280 can be generated by the circuit of FIG. 3A. A square waveform 360 from the sample clock is input to the negative port 370 of operational amplifier 380. Operational amplifier 380 is configured in an integrator mode wherein variable resistors $R_1$, $R_2$, and capacitor $C_1$ have values that are chosen for the particular application desired. The positive lead of operational amplifier 380 is grounded at 390. In the integrating mode, operational amplifier 380 turns square waveform 360 into some other continuously varying signal. In preferred embodiments, operational amplifier 380 outputs a triangle wave 400.

Triangle wave 400 is input to the positive input 410 of comparator circuit 420. Triangle wave 400 is also input to the positive input 430 of comparator circuit 440. The output of DAC 450 is input to the negative input 460 of comparator 420. The output of DAC 470 is input to the negative input 480 of comparator 440. In this configuration, comparator circuits 420 and 440 output signals 490 and 500 whenever the amplitude of the triangle wave 400 is above the threshold of DACs 450 and 470 respectively.

Signal 490 is input to a first input 510 of an exclusive OR gate 520. The exclusive OR gate 520 has a second input 530 which is adjustable to allow exclusive OR gate 520 to output a signal 540. Additionally, signal 500 is input to the first input 550 of a second exclusive OR gate 560 having a second input 570 which is also variable to produce an output 580. Signals 540 and 580 can be input to the circuits shown in FIG. 2A at 305, 285 and 315, 295, or to the circuit of FIG. 2B at 810 and 820 to form the qualifying signal. In this fashion, DACs 450 and 470 and signal polarity selections 530 and 570 provide complete control for trigger window positioning.

Figure 3B:
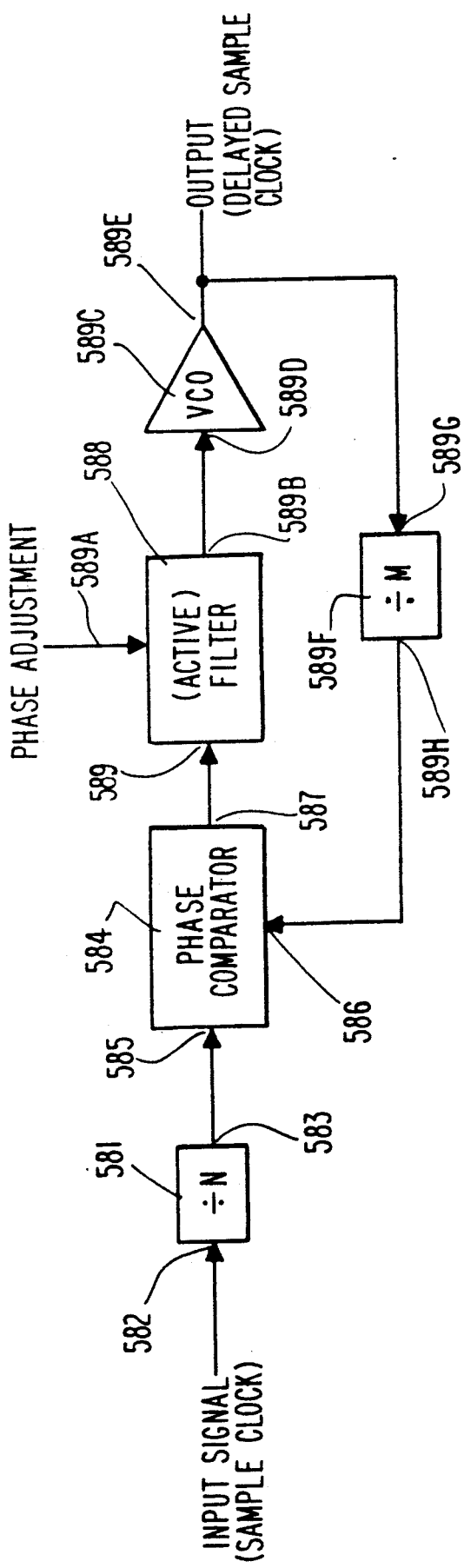

In preferred embodiments, a phase-locked loop (PLL) may be used to implement the variable delays in a trigger qualifier circuit 260 provided in accordance with this invention. As shown in FIG. 3B, an input signal is applied to a "divide by" N element 581 at node 582 to produce an output at node 583. If the input is a 20 MHz squarewave, then the output could be, for example, a 5 MHz signal which also might be a squarewave. The output is applied to the input node 585 of a phase comparator element 584. Phase comparator 584 compares the signal at node 585 with a feedback signal 586. A phase error signal is output by phase comparator 584 at 587. In preferred embodiments, phase comparator 584 is a digital circuit, analog circuit, or combination digital and analog circuit.

The form of the output 587 depends on the particular characteristics of phase comparator 584. Output 587 is input at 589 to a filter element 588. It is preferred that the filter element be an active filter element comprising a high gain opamp circuit. In preferred embodiments, an offset signal 589A is input to the active filter 588. The output 589B from active filter 588 is input at 589D to a voltage controlled oscillator (VCO) 589C. VCO 589C outputs a signal whose frequency is proportional to the voltage at its input node 589D. In preferred embodiments the form of this output signal is generally a sine wave or a squarewave. Signal 589E is a variably delayed signal which can be used as the variable delay signals 270 or 280 in FIGS. 2A and 2B. Variable delay signal 589E is also used in a feedback loop by inputting the signal to "divide by" M element 589F at input node 589G. The output 589H of "divide by" M element 589F is input to phase comparator 586.

A feedback loop comprising elements 584, 588, 589C and 589F uses negative feedback to force the frequency of output 589E to be equal to the input frequency multiplied by M divided by N. In preferred embodiments, the PLL locks signals 583 and 586 either 0°, 90° or 180° out of phase. In further preferred embodiments, phase adjustment input 589A may be used to add an offset which is compensated by the feedback loop. The phase between signals 583 and 586 may be adjusted by the PLL until the change in the phase comparator output 587 cancels the offset applied at 589A. Input 589A can thus be used to provide a variable phase control. When the variable phase control 589A is applied to the PLL at a constant frequency, the variable phase control becomes a variable time delay.

In still further preferred embodiments, the sample clock of the random repetitive signal acquisition system is fed to the PLL at 582. When the output 589E of the PLL must be the same frequency as the input 582, it is necessary that M=N. Furthermore, typical phase comparators shown at 584 have a range of phases which depend upon the particular type of circuit used. To maintain the loop in a phase-locked condition, the range of phase adjustment that is allowed at nodes 583 and 586 is necessarily limited. Typical phase comparators allow from 90° to 360° of phase error. However, when noise and jitter are input to the system, these comparators cannot be pushed to their full operating range and still be expected to keep the loop in a locked state.

If M and N are greater than 1, for example, 2 or 4, the amount of phase variation required at nodes 583 and 586 is reduced by 2 or 4 (M). Thus, for a sample input clock running at 20 MHz and M=N=4, the signals at nodes 583 and 586 are 5 MHz, and a 90° phase shift at 5 MHz translates to a 360° phase adjustment of the 20 MHz signal at output 589E.

Figure 4:
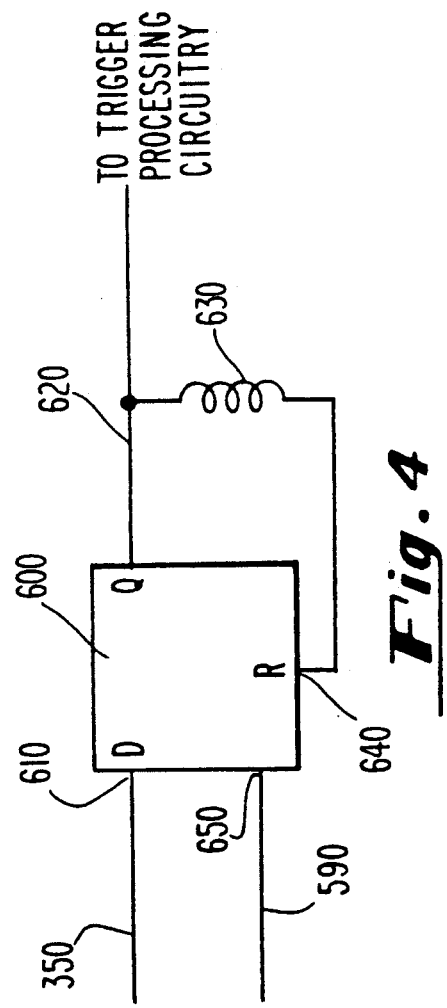
FIGS. 4 is a circuit for producing a qualified trigger signal in accordance with this invention.

In to FIG. 4, qualification signal 350 is used to qualify the trigger signal 590. Trigger signal 590 is asynchronous to the sample clock and is input to a flip-flop 600. In preferred embodiments, flip-flop 600 is a D flip-flop. Qualifier signal 350 is input to the D input 610 of D flip-flop 600. Trigger signal 590 is input to the clock input 650 of D flip-flop 600. Output 620 stays low until a trigger occurs while qualification signal 350 is high. Output 620 then goes high. Output 620 is fed back to reset input 640 through delay element 630 to bring output 620 low again. Thus, all trigger events that occur while qualification signal 350 is high result in a qualified trigger output 620, which is then input to the trigger processing circuitry.

Figure 5:
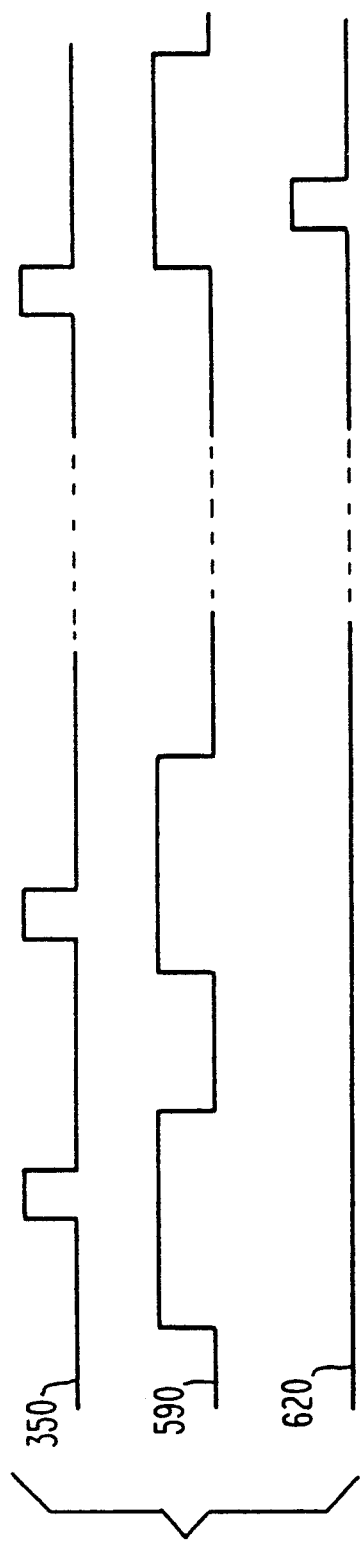
FIG. 5 is a timing diagram of the signals present in the circuit of FIG. 4.

In to FIG. 5, a timing diagram signifying the various signals appearing in FIG. 4 is shown. Signal 350 has a duty cycle which varies directly with the oscilloscope's sweep speed setting. Trigger signal 590 is a standard asynchronous trigger signal found in random repetitive sampling systems. The qualified trigger 620 provided in accordance with this invention terminates data acquisition only when a usable sample is detected. Thus, qualified trigger signal 620 greatly increases the throughput of the system.

For example, if trigger signal 590 is occurring at 15.0 MHz, trigger 590 has a period of 67.0 ns. Further assuming, for example, that the sample rate is 40 MHz, then the time between samples is 25.0 ns. With a screen width of 1.0 ns, the time between samples is 25 times larger than the screen width. Therefore on average, a usable trigger signal 590 is received every 67.0 ns * 25.0 = 1.675 μs. After starting to look for a trigger, the average time to find a usable trigger is 1.675 μs.

Typical random repetitive digitizing oscilloscopes have an acquisition overhead time of about 6.0 μs. With qualified trigger signal 620 provided in accordance with this invention, a usable sample is acquired about every 7.675 μs, i.e. the sum of the average time to find a usable trigger plus the overhead time. Without qualified trigger signals provided in accordance with this invention, it takes the system an average of about 150.8 μs to acquire a usable sample. Therefore, for this exemplary case, the invention increases throughput by a factor determined by dividing 150.8 by 7.675, or about 19.7 times. In general, the longer the overhead time and the faster the trigger repetition rate, the closer the improvement is to the maximum possible, or 25 in this example. Thus, circuitry provided in accordance with this invention solves a long felt need in the art for qualified trigger signals which dramatically increase the throughput in systems which utilize random repetitive signal acquisition.

Figure 6:
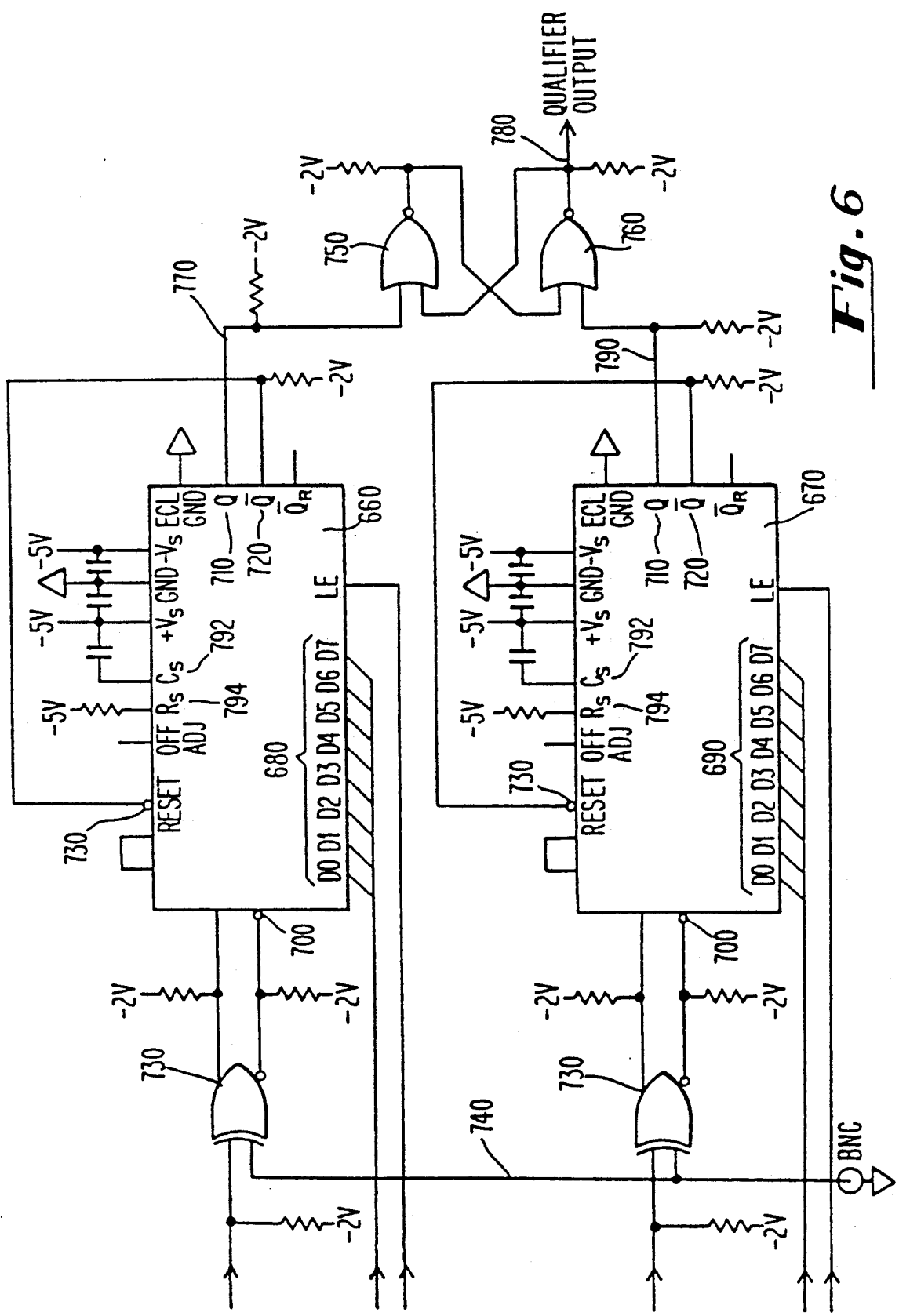
FIG. 6 is a circuit for producing a qualifier signal provided in accordance with this invention using linear integrated circuits to produce variable delays.

In preferred embodiments, the trigger qualifier signal may be obtained with the circuit shown in FIG. 6. Signal 780 is analagous to signal 350 in FIGS. 2A and 2B. The variable delays are accomplished with a pair of integrated circuits 660 and 670. In further preferred embodiments, integrated circuits 660 and 670 are linear integrated circuits. An excellent linear integrated circuit which can be used to provide programmed delays is the AD9500 Digitally Programmable Delay Generator manufactured and sold by the Analog Devices Company. The AD9500 selects program delays through an 8-bit digital code with resolutions as small as 10 psec.

Microprocessor 210 programs the AD9500 integrated circuits 660 and 670 with a byte of data, i.e., 8 individual bits shown at 680 and 690 on integrated circuits 660 and 670 respectively. The 8 bits of data provide a total possible 256 programmed delays. Each AD9500 has a trigger input shown at 700. When the trigger input goes high, the delay is started.

The delay is generally the sum of the minimum delay through the AD9500 and the program delay provided by the 8 bits of data 680 and 690. After the delay, the Q output 710 goes high and the not Q output 720 goes low. The device, 660 or 670, is then immediately reset at 730 so that Q 710 resets a delay after it goes high. The end result is a narrow pulse output at Q 710 occurring with a programmable delay from the trigger input.

Exclusive OR gates 730 coupled to the trigger inputs 700 allow microprocessor 210 to select which edge of the input sample clock will trigger each AD9500. Exclusive OR gates 730 selectively invert the clock signal coming in over line 740. Clock signal 740 causes the AD9500s to trigger. The AD9500 at 660 creates a "start" pulse while the AD9500 at 670 creates a "stop" pulse. NOR gates 750 and 760 coupled to the Q outputs of each AD9500 form a flip-flop. The start pulse 770 sets the qualifier output 780 high, while the stop pulse 790 sets the qualifier output 780 low. In preferred embodiments, if both pulses are active at the same time, stop pulse 790 has priority.

This arrangement produces a very narrow pulse on the output of OR gate 760 by causing start pulse 770 to occur just before stop pulse 790. The short output pulse is determined by the difference in delays, not by the actual pulse widths. However, the minimum low time is determined by the pulse widths.

The AD9500s in the circuit of FIG. 6 allow for delays in pulse widths in minimum steps of approximately 200 psec with 360° delay coverage and pulse widths from zero to greater than 50 ns. The programmed delays are, in part, also determined by capacitors and resistors shown at 792 and 794 respectively. The use of exclusive OR gates 730 are necessary because of the non-zero delay in resetting the AD9500s and the non-zero minimum delay.

If a rising edge of the sample clock 740 is used to trigger the AD9500s, and if the delay must be programmed to provide a start (stop) pulse "close to" the rising edge of the sample clock, then the delay must be programmed to provide a delay of one sample clock period, since the minimum delay is too long for the start (stop) pulse to be close to the rising edge. Furthermore, the start (stop) pulse delay cannot be negative if it is desired to place the rising edge just before the sample clock rising edge. The start (stop) pulse will then occur just at the next rising edge of the sample clock. This next edge cannot retrigger the AD9500 since it has not yet finished its delay-reset cycle. The AD9500 cannot retrigger until the second sample clock edge following the sample clock edge that caused the initial trigger occurs. Thus, the qualifier signal may only occur once for every two sample clock periods and the throughput has been reduced by a factor of 2 from the theoretical "best."

With the EXOR gates 730 in place, the AD9500 may be triggered on the falling edge of the sample clock. the programmed delay provides a start (stop) pulse on the rising edge of the sample clock and the AD9500 is reset and ready to be triggered again on the next falling edge of the sample clock. The two EXOR gates 730 can be programmed independently to provide the optimum trigger signal (rising or falling edge of the sample clock) to each AD9500 for its required delay.

Figure 7:
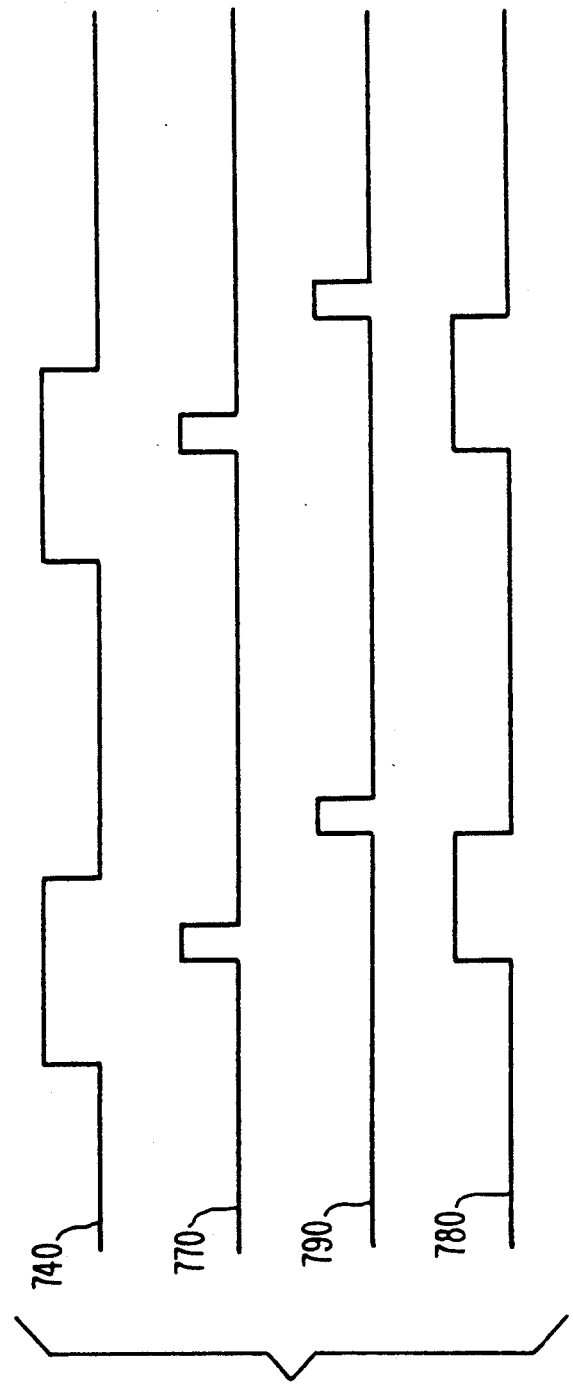
FIG. 7 is a timing diagram of the signals present in the circuit of FIG. 6.

In FIG. 7, the timing diagram for the circuit of FIG. 6 is shown with the sample clock pulse at 740. Start pulse 770 enables the qualifier signal 780 while stop pulse 790 disables qualifier pulse 780. Qualifier pulse 780 is sensitive to high levels on start pulse 770 and stop pulse 790. The circuit exemplified in FIG. 4 may be used in preferred embodiments to provide complete implementation of the qualified trigger by inserting it in the trigger path just before a trigger flip-flop such as, for example, the trigger flip-flop of FIG. 9.

Figure 8:
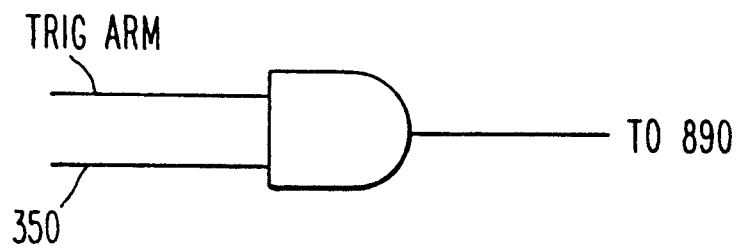
FIG. 8 shows an implementation in accordance with the invention of a qualified trigger arm signal from an existing trigger arm signal and a trigger qualifier signal.
Figure 9:
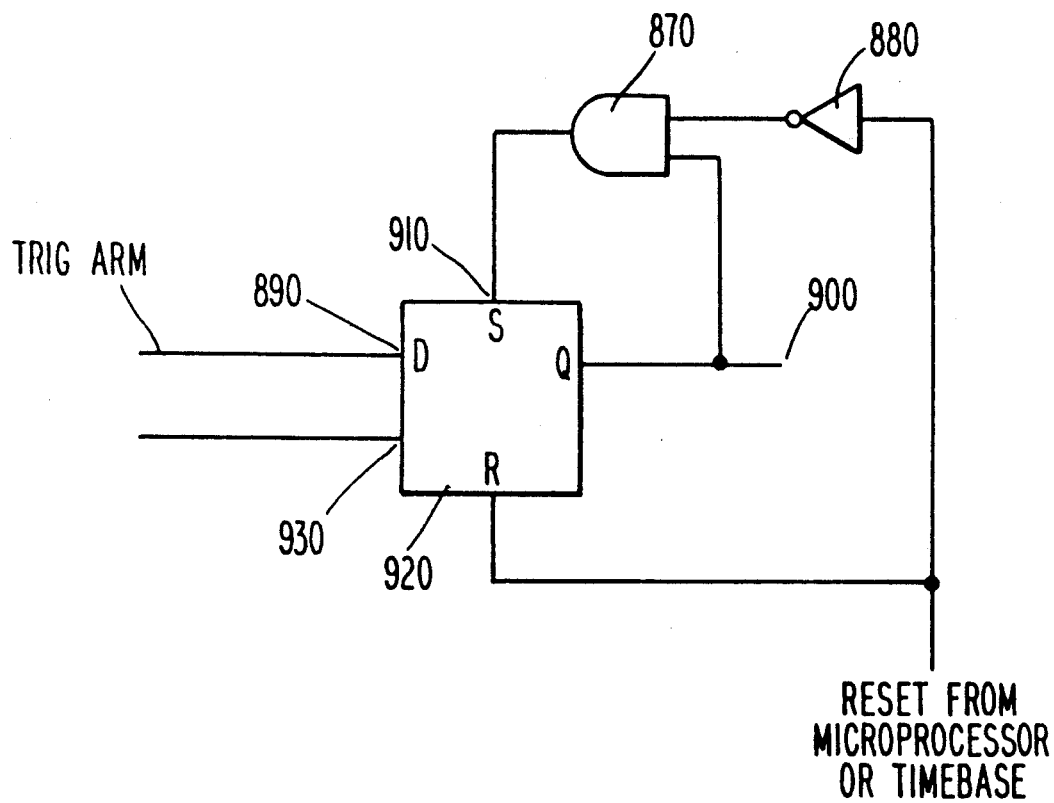
FIG. 9 illustrates a preferred embodiment of a circuit provided in accordance with the invention for producing a qualified trigger signal.

However, since a logic element is used in the trigger path, the circuit of FIG. 4 introduces a significant amount of jitter to a random repetitive acquisition system. In further preferred embodiments, trigger qualifier signal 350 may be "ANDed" with an existing trigger arming signal as shown in FIG. 8 to form a qualified trigger arm signal. As shown in FIG. 9, the qualified trigger arm is applied to input 890 of D flip-flop 920 which outputs a qualified trigger signal at 900. Triggered signal 900 is ANDed at 870 with inverted reset signal 880 and input to the set input 910 of D flip-flop 920. The trigger signal is input to flip-flop 920 at clock input 930.

In preferred embodiments, either the user or the microprocessor can determine the delay settings. In order to determine the delays, it must be first recognized that the analog delays from the instrument input to the trigger circuit, and from the instrument input to the sampler are not usually identical. Let the difference in these two delays paths be denoted as $t_{(t-s)}$. If $t_{(t-s)}$ is a positive number, then the delay through the trigger path is longer than the delay through the sampler path. Thus for example, a sample taken $t_{(t-s)}$ before the trigger is received results in that sampling lying on the triggering event. In preferred embodiments, a digitizing oscilloscope comprises a CRT screen wherein data traces are displayed.

Figure 10:
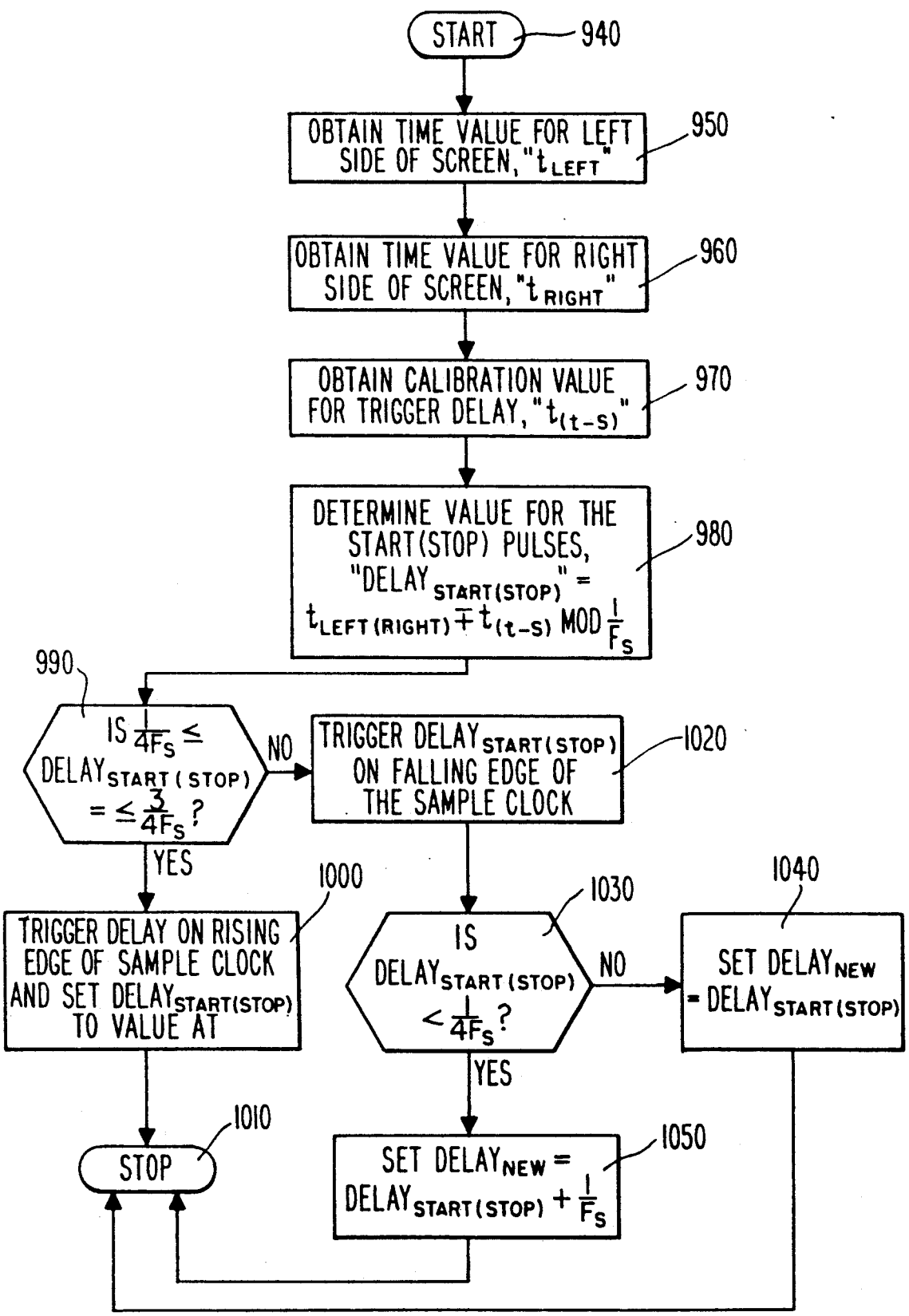
FIG. 10 is a flow chart illustrating a preferred embodiment of a method for calibrating a random repetitive signal acquisition system.

FIG. 10 illustrates a programming process which makes use of $t_{(t-s)}$ beginning at step 940. It is desired to find the time value of the left side of the screen with respect to the trigger point. This time value is denoted at step 950 as $t_{left}$ and may be set by the user in preferred embodiments. Similarly, the time value for the right side of the screen with respect to the trigger point, $t_{right}$, is specified at 960.

To find the delay value for the start and stop pulses, herein denoted "start(stop)", it is first necessary to specify the calibration value $t_{(t-s)}$ at step 970, which in further preferred embodiments is defined as a calibration value associated with the trigger delays in the system. At step 980, the delay values "delay$_{start}$" and "delay$_{stop}$" can be obtained respectively by the following equations:

$$\text{delay}_{start} = (t_{left} - t_{(t-s)}) MOD \frac{1}{F_s},$$

$$\text{delay}_{stop} = (t_{right} + t_{(t-s)}) MOD \frac{1}{F_s}.$$

As known by those with skill in the art, $(t_{left} - t_{(t-s)})$ MOD $1/F_s$ is a mathematical operation accomplished by finding the remainder of dividing $(t_{left} + t_{t-s})$ by $1/F_s$. If this remainder is greater than zero, than delay$_{(start)}$ is set to this value. Otherwise, $1/F_s$ is added to this remainder to form a new value, and delay$_{start}$ is set to this new value.

It is then desired to analyze the delay start(stop) times to determine where to trigger the delay with respect to the sample clock signal. This is accomplished at step 990 for the two pulses, delay$_{start(stop)}$, by determining whether:

$$\frac{1}{4F_s} \leq \text{delay}_{start(stop)} \leq \frac{3}{4F_s}.$$

If the two delay values fall within this range, then the delays are triggered at step 1000 on the rising edge of the sample clock, and the delay$_{start(stop)}$ values are set to the values determined at step 980 respectively. The programming process is then stopped at step 1010.

However, if the delay$_{start(stop)}$ values are not within the range specified at step 990, it is desired at step 1020 to trigger the delay$_{start(stop)}$ pulses on the falling edge of the sample clock. Preferably, it is determined at step 1030 whether the delay$_{start(stop)}$ value is $<1/4F_s$. If delay$_{start(stop)}$ is not less than $1/4F_s$, then the delay value, now denoted as delay$_{new}$, is set equal to delay$_{start(stop)}$ at step 1040. However, if it is determined that delay$_{start(stop)}$ is less than $1/4F_s$, then delay$_{new}$ is set equal to delay$_{start(stop)} + 1/F_s$ at step 1050. The system is then said to be calibrated to the trigger delays, and the programming procedure ends at step 1010. In preferred embodiments, the delay limits are optimal with a 50% duty cycle of the sample pulse. It is expected that other duty cycles will lead to similar optimal values.

As an example of this programming procedure, consider a window having a sweep speed of 100 psec/div with the trigger point being 100 psec to the right of the left edge of the screen, and the sample rate, $F_s$, equal to 40 MHz. Thus, $t_{left}$ equals $-100$ psec, and $t_{right}$ equals 900 psec. If in preferred embodiments $t_{(t-s)}$ equals $-230$ psec, then delay$_{start}$ is 24,670 psec, and delay$_{stop}$ equals 670 psec. Since $1/4F_s$ equals 6250 psec, and $3/4F_s$ equals 18,750 psec, it is necessary to trigger the delays on the falling edge of the sample clock. Furthermore, since delay$_{stop} = 670$ psec is less than $1/4F_s$, delay$_{stop}$ is programmed to 670 psec + 25 nsec = 25,670 psec.

In further preferred embodiments, the digitizing oscilloscope's microprocessor can perform these calculations. However, it will be recognized by those with skill in the art that the user can also perform the programming procedure and calculations.

Trigger qualifier circuitry 260 provided in accordance with this invention also requires conversion of the delay$_{start(stop)}$ qualifier values to binary values which can be used by the delay generator. The time interpolator determines the timing between the asynchronous trigger event and the next sample point within a design resolution, for example, 10 psec. This can be viewed as a calibration which relates the start and stop delay DAC values for the DACs of FIGS. 2A and 2B to start and stop time interpolator values which can be used by the microprocessor and time interpolator in the crystal timebase 155.

With a random repetitive signal acquisition system having a 1 nsec screen width and 100 psec of pretrigger time, the microprocessor must either be informed of, or determine, the stop and start time values to send to the delay DACs in FIGS. 2A and 2B. The relationship between the actual binary DAC values and time delays may be assumed to be linear. However, if the relationships are not adequately linear, they may be piece-wise linearly approximated, or approximated by a polynomial expression. When the calibration relationships are linear, the calibration procedure comprises finding "gain" and "offset" values for the start and stop time interpolator values over the range of operation of the time interpolator in the random repetitive signal acquisition system. In further preferred embodiments when the AD9500 integrated circuits are used to provide programmed delays, one gain value for each AD9500 and one offset value for each trigger source (positive or negative edge triggered) for each of the AD9500s, or a total of six calibration values must be obtained.

There are a number of methods which could be used to perform the calibration delay time conversion to start/stop binary DAC values. In preferred embodiments, the designer could calculate the gain and offset values from the actual circuit components including component tolerances. No software is needed for calibration with this method and no user time is needed to periodically calibrate the circuit. However, with this method the window width must typically be larger than required in order to guarantee that worst-case components will still give an adequate window size. This is inefficient since the typical window is bigger than required and therefore accepts a larger percentage of triggers which do not result in useful samples. Use of high precision components will generally result in a more expensive circuit, and thus the design method is generally undesirable.

In still further preferred embodiments, a means to inject the start and stop signals or the trigger qualifier signal into the trigger path may be provided so that calibration is accomplished by disabling the trigger qualifier and feeding the start(stop) signal or trigger qualifier signal to the trigger circuit. The time interpolator may then measure the time between the signal's edge and the sample clock. One measurement would be required for each gain or offset value, and a single measurement could consist of a large number of individual measurements averaged together for accuracy. A circuit of this type to accomplish calibration is not actually part of the operational configuration of the oscilloscope, and so the designer would then have to determine how to modify the calibration (offset) values by relating the delays through the calibration path to the delays through the operational path. This method is relatively fast but since component tolerances are used to relate the operational path and the calibration path, the window width is generally larger than is actually needed to accommodate any possible collection of parts in the instrument. Furthermore, inherent component tolerances reduce the efficiency of the circuit.

Another method to calibrate the delay times to start/stop DAC values is to use a software or firmware program at run time which can determine how to modify the start and stop pulses and optimize the allowed trigger window. With this method, a histogram of time interpolator values is built using random external triggers that occur at run time. The microprocessor can compare a histogram of time interpolator values to a desired histogram and then dynamically adjust the qualifier window. This is an extremely accurate method of calibration since it is essentially a feedback circuit with a large loop gain. However, this method requires a large amount of microprocessor power during run time and therefore decreases the throughput of the random repetitive signal acquisition system.

In still further preferred embodiments, a histogram of time interpolator values may be used to statistically determine the calibration parameters. With this method of calibration, the start and stop control DACs are set to predetermined values and may be further positive/negative sample clock edge triggered if applicable. A large number of random triggers with respect to the sample clock are then generated either by external circuitry, or by the microprocessor. A histogram of time interpolator values is maintained for a statically significant number of samples, depending upon the resolution of the time interpolator and delay generators. The histogram is then analyzed to determine the exact position of the trigger window. This procedure can then be repeated with new DAC settings and the results can be combined to find the gain and offset values. If applicable, another set of measurements is required with the opposite sample clock edge trigger selected.

Figure 11:
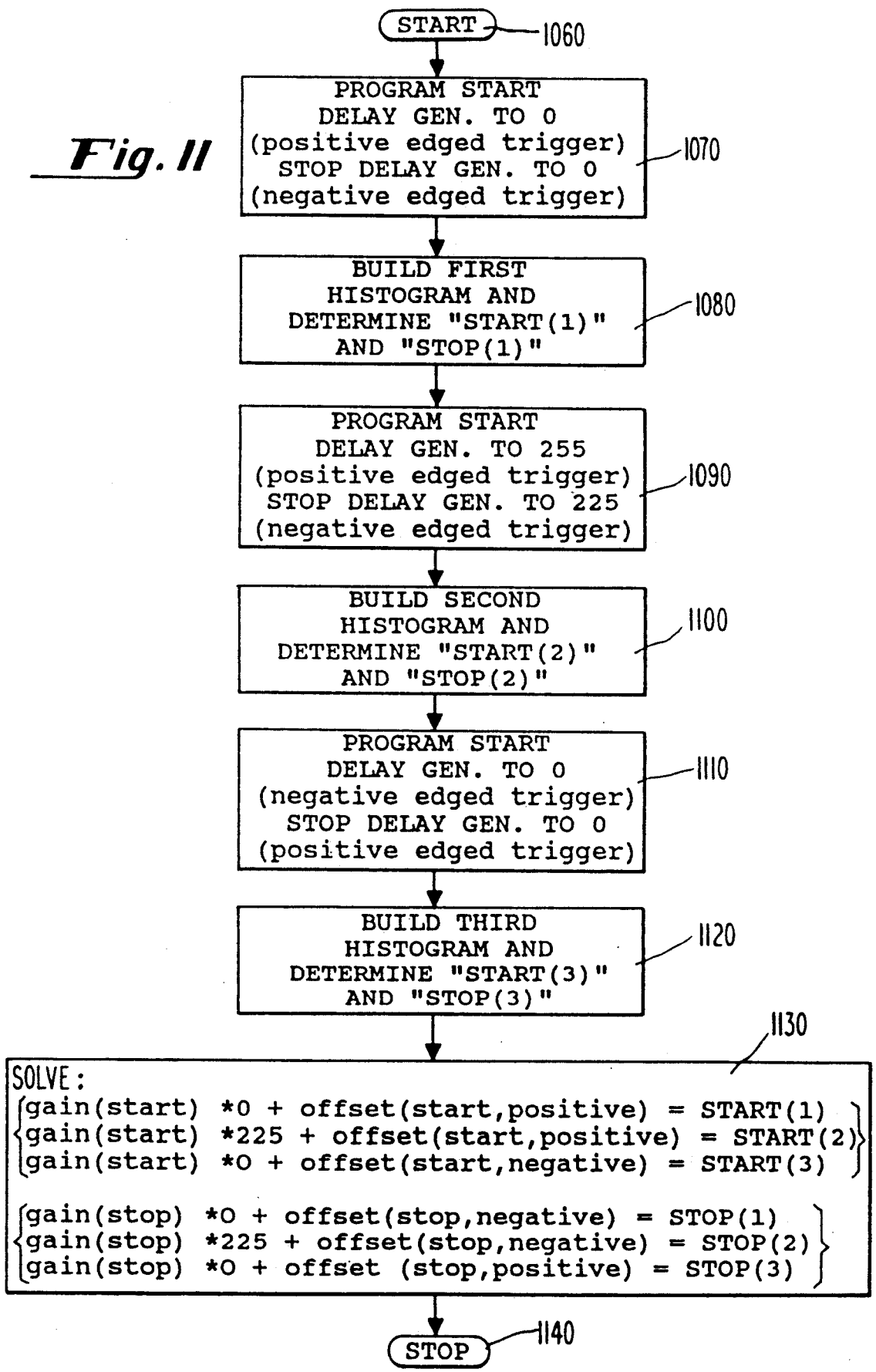
FIG. 11 is a flow chart illustrating a preferred embodiment of a method of building a histogram to convert delay values to programming values for the start and stop time delay generators' digital to analog converters in a random repetitive signal acquisition system.

In yet further preferred embodiments, the histogram calibration method can be used with the AD9500 integrated circuit which provides programmed delays for the qualifier circuit. FIG. 11 illustrates a method of building a histogram in accordance with the invention. The method begins at step 1060. At step 1070 it is desired to program the start delay generator to zero to be triggered on the positive edge of the sample clock, and the stop delay generator to zero to be triggered on the negative edge of the sample clock. At step 1080, a histogram is built with a statistically significant number of samples, and the first start time "start(1)" and first stop time "stop(1)" are determined from the histogram.

At step 1090 it is then desired to set the start delay generator to some predetermined value to be positively edge triggered, and the stop delay generator to the same predetermined value to be negative edge triggered. In preferred embodiments when the AD9500s are used which have an 8-bit per programmed input, a possible 256 different programmed delays are possible, and therefore, the predetermined value is set to 255. At step 1100, a second histogram is constructed and start(2) and stop(2) are determined.

Similarly, at step 1110, the start delay generator set to zero and is negative edge triggered, while the stop delay generator is set to zero and is positive edge triggered.

At step 1120 a third histogram is built and start(3) and stop(3) are determined.

After the first, second, and third start and stop time values are determined, it is necessary to solve the following linear equations which relate the delay values to the time interpolator DAC values:

gain(start) *0+offset(start,positive)=start(1)
gain(start) *PV+offset(start,positive)=start(2)
gain(start) *0+offset(start,negative)=start(3)

gain(stop) *0+offset(stop,negative)=stop(1)
gain(stop) *PV+offset(stop,negative)=stop(2)
gain(stop) *0+offset (stop,positive)=stop(3);
where,
offset(start,positive) = a time offset associated with the first and second start times when the first delay is triggered on the positive edge of the sample signal,
offset(start,negative) = a time offset associated with the third start time when the first delay is triggered on the negative edge of the sample signal,
offset(stop,negative) = a time offset associated with the first and second stop times when the second delay is triggered on the negative edge of the sample signal,
offset(stop,positive) = a time offset associated with the third stop time when the second delay is triggered on the positive edge of the sample signal,
gain(start) = the gain of the start delay generator, in time per program count,
gain(stop) = the gain of the stop delay generator, in time per program count,
PV = the predetermined value.

The above six equations have six unknowns and relate the positive and negative edge triggered offsets and the gains to the start and stop DAC values determined from the histograms. In preferred embodiments, it is desirable to use a low DAC value, i.e., zero, to find the offset and a high DAC value, i.e., 255, to find the gains. This minimizes the errors in finding these values. The equations yield the following solutions:

offset(start,positive)=start(1)
gain(start)=[start(2)−start(1)]/PV
offset(start,negative)=start(3)
offset(stop,positive)=stop(1)
gain(stop)=[stop(2)−stop(1)]/PV
offset(stop,negative)=stop(3).

At run time, these calibration values may be used in a linear equation to turn the desired start(stop) delay time into a binary value to program the start(stop) delay generator. In preferred embodiments, the linear equation is:

delay time$_{start(stop)}$=offset(start/stop){slope}+gain-start/stop * PV, where the "slope" is a function of the particular delay generators used. In general, PV may be other than 0 and 255 when other than an AD9500 is used, and therefore the above equation can be solved for PV. Since PV is an integer value it should be appropriately rounded.

It is also desirable to keep the trigger qualifier window small to minimize the number of iterations the time interpolator must run to build the histograms. For example, assume that one million random triggers are used to build each histogram. With the above programming procedure, then each trigger qualifier window is approximately half the size of the sample period so half of the random triggers would cause the time interpolator to run. Thus, the time interpolator would run an average 500,000 times at 6 μsec each for a total time of 3 seconds to build each histogram. If the procedure is modified so that only a "start(n)" or "stop(n)" value is found with each histogram, then the second (stop or start) delay can be programmed to give a small trigger window.

For example, if the second delay is programmed to give a trigger qualifier window that is only one fiftieth of the sample period, then the time interpolator will only have to run 20,000 times, on average, to build a histogram. Since two histograms must be build to find both start(n) and stop (n), the total calibration time is 2*20,000 * 6 μsec=240 msec. Then, high accuracy can be achieved with a relatively short calibration time by calibrating the start DAC using the stop DAC to provide a small trigger qualifier window, and then calibrating the stop DAC by using the start DAC to provide a small trigger qualifier window.

This method has the advantage of being extremely accurate at the calibration temperature of the system. However, after accounting for component drift with temperature, it may be only slightly better than both the design and trigger disabling methods discussed above. Furthermore, calibration drift as the temperature of the digitizing oscilloscope changes forces recalibration of the time interpolator when the digitizing oscilloscope is being used. This method is also relatively time consuming, taking an average of about one-half second to three seconds to build each histogram, with attendant time added in analyzing each histogram to find the particular start and stop DAC values.

When examining the histogram, the time interpolator outputs values over its defined range within a predetermined resolution. For example, the time interpolator may output values from 0 ns to 50 ns with a one psec resolution. In the absence of noise, the histogram would have a rectangular shape with the edges of the rectangle defining the start and stop times of the qualifier pulse. When noise is added it becomes a statistical task to determine how many samples are necessary to build the histogram and to determine the actual placement of the edges of the pulse for the required accuracy. Analysis of histograms provides an accurate and relatively efficient method of converting the delay values to start and stop DAC values which are useful to the microprocessor to determine what values to program the start and stop DACs to for a particular instrument set-up.

There have thus been described certain preferred embodiments of trigger qualifying methods and apparatus for use in random repetitive signal acquisition systems. While preferred embodiments have been described and disclosed, it will be recognized by those with skill in the art that modifications are within the true spirit and scope of the invention. The appended claims are intended to cover all such modifications.

What is claimed is:

1. A digital system for acquiring and analyzing samples of an input waveform, comprising:
   a sample clock for providing a clock signal at a sample clock rate;
   random repetitive sampling means responsive to said sample clock for sampling the input waveform at said sample clock rate so as to acquire a series of samples as a function of time;
   triggering means for providing trigger signals relating said series of samples to a known trigger event for display;

trigger qualifier means responsive to said sample clock for creating a trigger qualifying time window with respect to each of said trigger signals within each period of said clock signal;

data acquisition control means responsive to said trigger qualifier means for stopping data acquisition by said sampling means in response to trigger signals from said triggering means during said trigger qualifying time window once a sample has been acquired;

means for analyzing said series of samples from said sampling means, said series of samples including only those samples acquired for trigger signals which occurred during said trigger qualifying time window; and means for displaying the analyzed samples.

2. A digital system as in claim 1, wherein said trigger qualifier means comprises a first variable delay circuit for delaying said sample clock by a first delay time and a second variable delay circuit for delaying said sample clock by a second delay time, the beginning and end of said trigger qualifying time window determining said second and first delay times, respectively.

3. A digital system as in claim 2, wherein said trigger qualifier means further comprises means responsive to a sample clock with said first delay time for starting the provision of said trigger signals to said data acquisition control means and means responsive to a sample clock with said second delay time for stopping the provision of said trigger signals to said data acquisition control means.

4. A digital system as in claim 3, wherein said starting and stopping means comprises a set/reset flip-flop which receives said sample clock with said first delay time at a set input thereof and said sample clock with said second delay time at a reset input thereof.

5. A digital system as in claim 3, wherein said starting and stopping means comprises first and second D-type flip-flops with high logic levels at D inputs thereof, an inverted output of said first D-type flip-flop being connected to a reset input of said second D-type flip-flop and a non-inverted output of said second D-type flip-flop being connected to a reset input of said first D-type flip-flop, said first D-type flip-flop having said sample clock with said first delay time at a clock input thereof and said second D-type flip-flop having said sample clock with said second delay time at a clock input thereof, whereby a non-inverted output of said first D-type flip-flop starts and stops the provision of said trigger signals to said data acquisition control means.

6. A digital system as in claim 2, wherein said first and second variable delay circuits comprise an integrating operational amplifier for integrating said sample clock and first and second comparator circuits responsive to said integrating operational amplifier at first inputs thereof and first and second threshold signals at respective second inputs thereof so as to output a sample clock with said first delay time when said first input of said first comparator circuit exceeds said first threshold signal and to output a sample clock with said second delay time when said first input of said second comparator circuit exceeds said second threshold signal.

7. A digital system as in claim 2, wherein said first and second variable delay circuits comprise respective phase locked loops which may be phase controlled to respectively output a sample clock with said first or second delay times.

8. A digital system as in claim 2, wherein said first and second variable delay circuits comprise respective programmable delay generators.

9. A digital system as in claim 2, wherein the first and second delay times of said first and second variable delay circuits are determined by said analyzing means.

10. A digital random repetitive sampling oscilloscope for acquiring and analyzing samples of an input waveform, comprising:

a sample clock for providing a clock signal at a sample clock rate;

random repetitive sampling means responsive to said sample clock for sampling the input waveform at said sample clock rate so as to acquire a series of samples as a function of time;

memory means for storing said series of samples;

triggering means for providing trigger signals relating said series of samples to a known trigger event for display;

trigger qualifier means responsive to said sample clock for creating a trigger qualifying time window with respect to each of said trigger signals within each period of said clock signal;

data acquisition control means responsive to said trigger qualifier means for stopping data acquisition by said sampling means in response to trigger signals from said triggering means during said trigger qualifying time window once a sample has been acquired;

means for analyzing said stored series of samples, said stored series of samples including only those samples acquired for trigger signals which occurred during said trigger qualifying time window; and means for displaying the analyzed samples.

11. A method of acquiring and analyzing samples of an input waveform, comprising the steps of:

sampling the input waveform at a sample clock rate from a sample clock so as to acquire a series of samples as a function of time;

providing trigger signals relating said series of samples to a known trigger event for display;

creating a trigger qualifying time window with respect to each of said trigger signals within each period of a clock signal from said sample clock;

stopping data acquisition by said sampling means in response to trigger signals during said trigger qualifying time window once a sample has been acquired;

analyzing said series of samples, said series of samples including only those samples acquired for trigger signals which occurred during said trigger qualifying time window; and displaying the analyzed samples.

12. A method as in claim 11, wherein said trigger qualifying time window creating step comprises the steps of delaying said sample clock by a first delay time and delaying said sample clock by a second delay time, the beginning and end of said trigger qualifying time window determining said second and first delay times, respectively.

13. A method as in claim 12, wherein said trigger qualifying time window creating step further comprises the steps of starting the provision of said trigger signals in said trigger signals providing step in response to a sample clock with said first delay time and of stopping the provision of said trigger signals in said trigger signals providing step in response to a sample clock with said second delay time.

14. A method as in claim 12, wherein said delaying steps comprise the steps of integrating said sample clock to produce an integrated output, comparing said integrated output to first and second threshold signals, outputting a sample clock with said first delay time when said integrated output exceeds said first threshold signal and outputting a sample clock with said second delay time when said integrated output exceeds said second threshold signal.

15. A method as in claim 12, wherein said delaying steps comprise the steps of:
  determining start and stop time values for provision of said trigger signals;
  obtaining a calibration value representing the difference in delay between (a) the delay from an input for said input waveform to means for providing said trigger signals and (b) the delay from said input for said input waveform to means for sampling;
  obtaining start and stop pulse delay values from said start and stop time values, said calibration value and said sample clock;
  analyzing the start and stop pulse delay values to determine where to trigger delays with respect to the sample clock so as to form said trigger qualifying time window; and
  determining whether to trigger delays with respect to rising or falling edges of the sample clock.

16. A method as in claim 15, wherein the step of obtaining a calibration value comprises the steps of:
  setting the first delay time to zero and triggering the start of the first delay time on a positive edge of the sample clock and setting the second delay time to zero and triggering the start of the second delay time on a negative edge of the sample clock;
  building a first histogram from a statistically significant number of said series of samples and determining a first delay start and a first delay stop time from the first histogram;
  setting the first delay time to a predetermined upper limit value and triggering the start of the first delay time on a positive edge of the sample clock and setting the second delay time to said predetermined upper limit value and triggering the start of the second delay time on a negative edge of the sample clock;
  building a second histogram from said statistically significant number of said series of samples and determining a second delay start and a second delay stop time from the second histogram;
  setting the first delay time to zero and triggering the start of the first delay time on a negative edge of the sample clock and setting the second delay time to zero and triggering the start of the second delay time on a positive edge of the sample clock;
  building a third histogram from said statistically significant number of said series of samples and determining a third delay start and a third delay stop time from the third histogram; and
  relating said first, second and third delay start and stop times to positive and negative edge triggered offsets and gains of the sample clock.

17. A digital system as in claim 1, wherein a horizontal sweep of said displaying means has a time duration approximately equal to a time duration of said trigger qualifying time window.

* * * * *